(12) United States Patent
Matsuda et al.

(10) Patent No.: US 11,789,044 B2
(45) Date of Patent: Oct. 17, 2023

(54) CURRENT DETECTION DEVICE

(71) Applicant: SUNCALL CORPORATION, Kyoto (JP)

(72) Inventors: Jun Matsuda, Kyoto (JP); Akio Mugishima, Kyoto (JP)

(73) Assignee: Suncall Corporation

(*) Notice: Subject to any disclaimer, the term of this patent is extended or adjusted under 35 U.S.C. 154(b) by 329 days.

(21) Appl. No.: 17/375,837

(22) Filed: Jul. 14, 2021

(65) Prior Publication Data
US 2021/0373051 A1 Dec. 2, 2021

Related U.S. Application Data

(63) Continuation of application No. PCT/JP2019/049723, filed on Dec. 19, 2019.

(30) Foreign Application Priority Data

Jan. 28, 2019 (JP) .................................. 2019-011920

(51) Int. Cl.
*G01R 19/00* (2006.01)
*H01C 13/02* (2006.01)

(52) U.S. Cl.
CPC ......... *G01R 19/0092* (2013.01); *H01C 13/02* (2013.01)

(58) Field of Classification Search
CPC .. G01R 19/0092; G01R 33/093; G01R 27/08; G01R 27/02; G01R 15/146; G01R 19/00; G01R 31/2886; G01R 27/14; G01R 31/311; G01R 31/28; G01R 27/205; G01R 31/66; G01R 31/58; G01R 31/70; G01R 35/00; G01R 31/3004; G01R 19/165; G01R 21/06; G01R 31/36; G01R 1/04; G01R 31/67; G01R 27/16; G01R 31/1263; G01R 31/2623; G01R 27/00; G01R 31/2879; G01R 33/1246; G01R 1/203; G06F 3/045;
(Continued)

(56) References Cited

U.S. PATENT DOCUMENTS 5,107,204 A * 4/1992 Bullock ............... G01R 15/146
324/105
6,791,315 B2 * 9/2004 Skerritt .................. G01R 19/32
324/130

(Continued)

FOREIGN PATENT DOCUMENTS

JP 2009-229133 A 10/2009
JP 2017-15588 A 1/2017

*Primary Examiner* — Vinh P Nguyen
(74) *Attorney, Agent, or Firm* — ST. ONGE STEWARD JOHNSTON & REENS LLC

(57) ABSTRACT

A current detection device has a first base material, a second base material, and a third base material that are coated with insulation and connected between a three-phase inverter and a motor. The first base material is disposed on the upper surface of the third base material in close contact therewith and comprises, in a section which is not coated with insulation, a first resistor and a first measurement terminal which are fixed atop the first base material. The second base material is disposed on the lower surface of the third base material in close contact therewith and comprises, in a section which is not coated with insulation, a second resistor and second measurement terminal which are fixed atop the second base material.

3 Claims, 4 Drawing Sheets

(58) Field of Classification Search
CPC ........... G06F 17/10; G06F 1/206; H01C 1/14;
H01C 13/00; H01C 1/148; H01C 13/02;
H01C 1/01; H01C 7/006; H01C 7/13;
H03K 17/0814; H03K 19/018507; H03K 19/0175

See application file for complete search history.

(56) References Cited

U.S. PATENT DOCUMENTS

| | | | |
|---|---|---|---|
| 10,859,600 B2* | 12/2020 | Endo | G01R 1/203 |
| 2017/0082661 A1 | 3/2017 | Schulz et al. | |
| 2018/0156847 A1* | 6/2018 | Nakamura | G01R 1/203 |

* cited by examiner

CURRENT DETECTION DEVICE

FIELD OF THE INVENTION

The present invention relates to a current detection device to be connected between a three-phase inverter and a motor.

BACKGROUND OF THE INVENTION

As a current detection device to be connected between a three-phase inverter and a motor, an example is described in Japanese Published Unexamined Patent Application No. 2009-229133 ("Patent Document 1"). The device described in Patent Document 1 is such that a current flowing in each phase is individually detected by three shunt resistors and thereby overcurrent protection is performed when any of the detected currents is an overcurrent exceeding a predetermined current amount.

SUMMARY OF THE INVENTION

Incidentally, since a large current flows in the wiring between the three-phase inverter and the motor when driving the motor, low resistance has been required to reduce electrical loss in recent years. Furthermore, it has also been required to have low inductance in which the wiring of each phase is closely attached in order to prevent a high frequency current generated by the three-phase inverter from radiating to the surroundings.

Therefore, it is conceivable to stack three shunt resistors in order to satisfy such demands.

However, there is a problem that when the three shunt resistors are stacked as described above, a substrate on which a current detection circuit is mounted cannot be arranged. Therefore, there is a problem that the demands for low resistance and low inductance cannot be satisfied.

Accordingly, in view of the foregoing problems, an object of the present invention is to provide a current detection device capable of satisfying the demands for low resistance and low inductance.

The object of the present invention is achieved by the following means. It is noted that reference signs of an embodiment to be described later is added in parentheses, but the present invention is not limited thereto.

According to the first aspect of the present invention, a current detection device (1) having a plurality of base materials (a first base material 2, a second base material 3, and a third base material 4) that are insulation coated and to be connected between a three-phase inverter (INV) and a motor (M) is characterized in that the plurality of base materials (the first base material 2, the second base material 3, and the third base material 4) are composed of a first base material (2), a second base material (3), and a third base material (4), and the first base material (2) is arranged in close contact with an upper surface of the third base material (4) and includes, on its portion not insulation coated, a first resistor (20), and a first measurement terminal (21) fixed on the first base material (2), and the second base material (3) is arranged in close contact with a lower surface of the third base material (4) and includes, on its portion not insulation coated, a second resistor (30), and a second measurement terminal (31) fixed on the second base material (3).

According to the second aspect of the present invention, the current detection device (1) according to the above first aspect is characterized by further including a first substrate (5) into which the first measurement terminal (21) is inserted and which is arranged and fixed in a position opposing the first base material (2), and a second substrate (6) into which the second measurement terminal (31) is inserted and which is arranged and fixed in a position opposing the second base material (3).

Further, according to the third aspect of the present invention, the current detection device according to the above second aspect is characterized in that predetermined places of the first base material (2), second base material (3), and third base material (4) arranged in close contact are all enclosed by an insulating case (7) so as to conceal the first substrate (5) and the second substrate (6) in a state in which the first substrate (5) is arranged and fixed in the position opposing the first base material (2) by the first measurement terminal (21) being inserted and the second substrate (6) is arranged and fixed in the position opposing the second base material (3) by the second measurement terminal (31) being inserted, and the insulating case (7) has an outer peripheral surface (7a) made conductive.

Next, advantageous effects of the present invention will be described with reference signs in the drawings. It is noted that reference signs of an embodiment to be described later are added in parentheses, but the present invention is not limited thereto.

According to the first aspect of the present invention, the insulation coated first base material (2) is arranged in close contact with the upper surface of the insulation coated third base material (4), and the insulation coated second base material (3) is arranged in close contact with the lower surface of the third base material (4). Moreover, when the first resistor (20), and the first measurement terminal (21) fixed on the first base material (2) are provided on the portion not insulation coated of the first base material (2), the first measurement terminal (21) is inserted into the first substrate (5), so that the first substrate (5) can be arranged and fixed in the position opposing the first base material (2) as in the second aspect of the present invention. Furthermore, when the second resistor (30), and the second measurement terminal (31) fixed on the second base material (3) are provided on the portion not insulation coated of the second base material (3), the second measurement terminal (31) is inserted into the second substrate (6), so that the second substrate (6) can be arranged and fixed in the position opposing the second base material (3) as in the second aspect of the present invention.

Thus, according to the present invention, the first substrate (5) and the second substrate (6) can be arranged in a state in which the first base material (2), the second base material (3), and the third base material (4) are arranged in close contact. As a result, the demands for low resistance and low inductance can be satisfied.

According to the third aspect of the present invention, since predetermined places of the first base material (2), second base material (3), and third base material (4) arranged in close contact are all enclosed by the insulating case (7) so as to conceal the first substrate (5) and the second substrate (6), and the insulating case (7) has the outer peripheral surface (7a) made conductive, the first substrate (5) and the second substrate (6) are also shielded, so that the high frequency current can be prevented from radiating to the surroundings.

DETAILED DESCRIPTION OF THE INVENTION

Hereinafter, an embodiment of a current detection device according to the present invention will be described specifically with reference to the drawings. It is noted that, in the following description, when vertical and horizontal directions are indicated, it shall mean vertical and horizontal directions when viewed from the front of the figure.

Figure 2A:
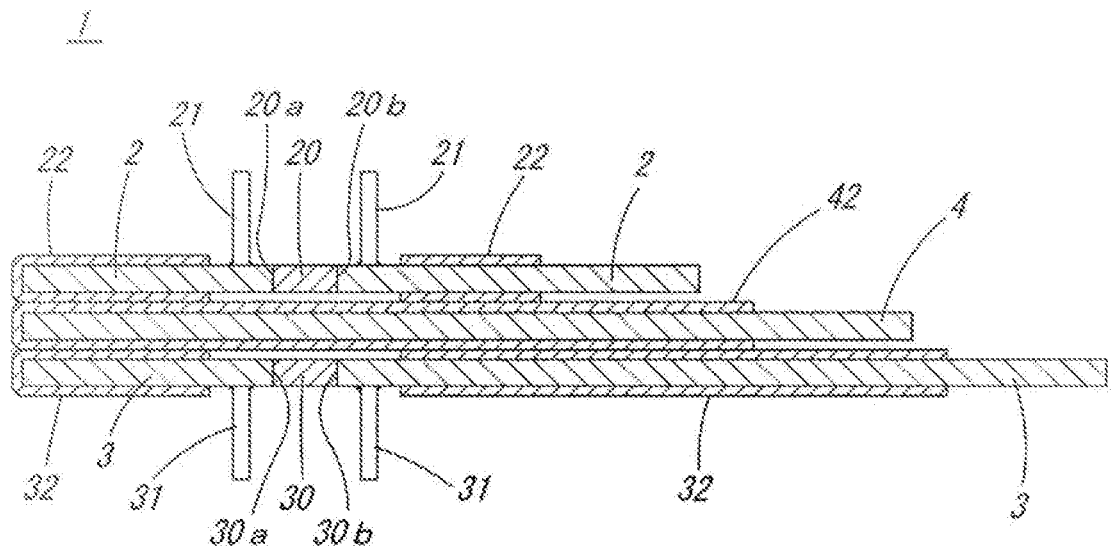
FIG. 2A is a cross sectional view of the current detection device according to the same embodiment.
Figure 2B:
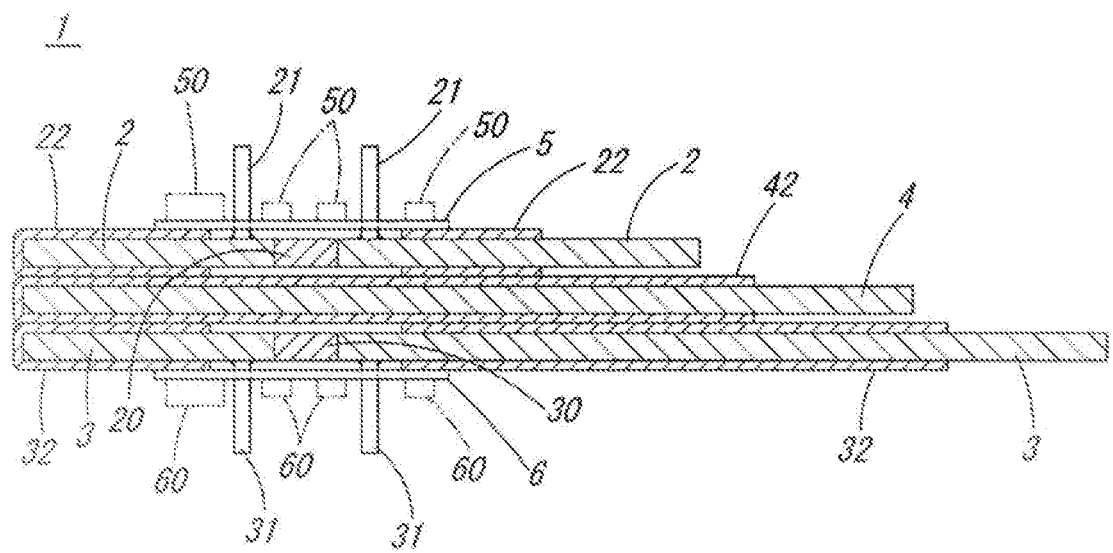
FIG. 2B is a cross sectional view showing a state in which a first substrate and a second substrate are mounted on the current detection device according to the same embodiment.
Figure 3:
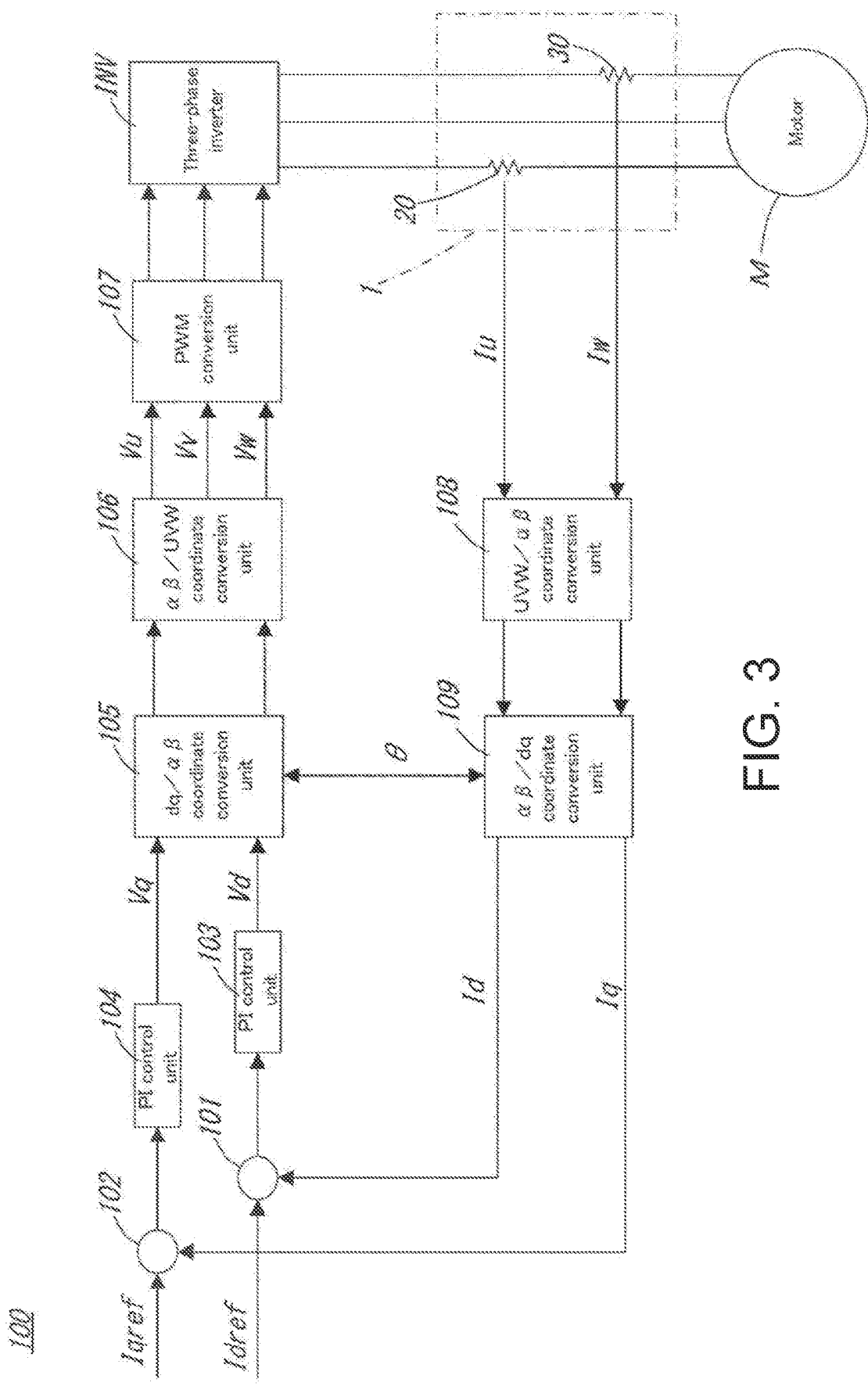
FIG. 3 is a conceptual block diagram showing a state in which the current detection device according to the same embodiment is connected to a motor control device.

A current detection device 1 according to the present embodiment is to be connected between a three-phase inverter INV and a motor M of a motor control device 100 shown in FIG. 3. The current detection device 1 will be described specifically with reference to FIG. 1 and FIG. 2.

Figure 1A:
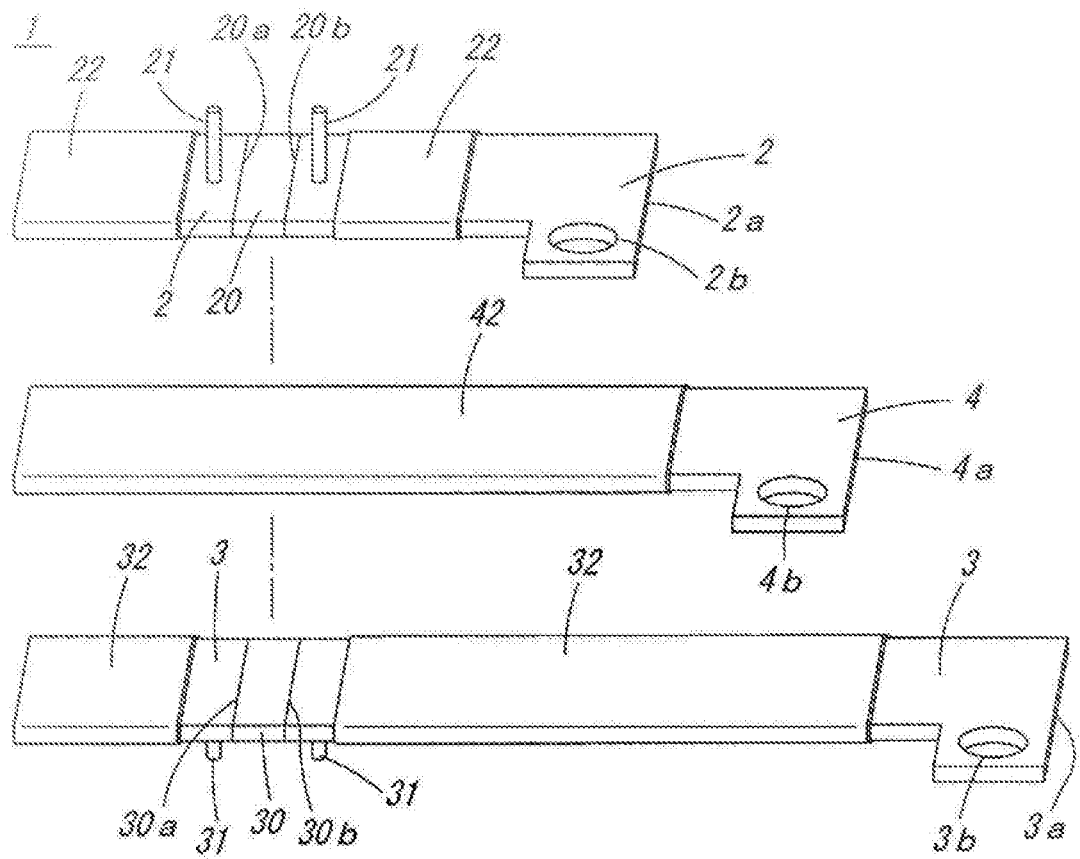
FIG. 1A is an exploded perspective view of a current detection device according to an embodiment of the present invention.
Figure 1B:
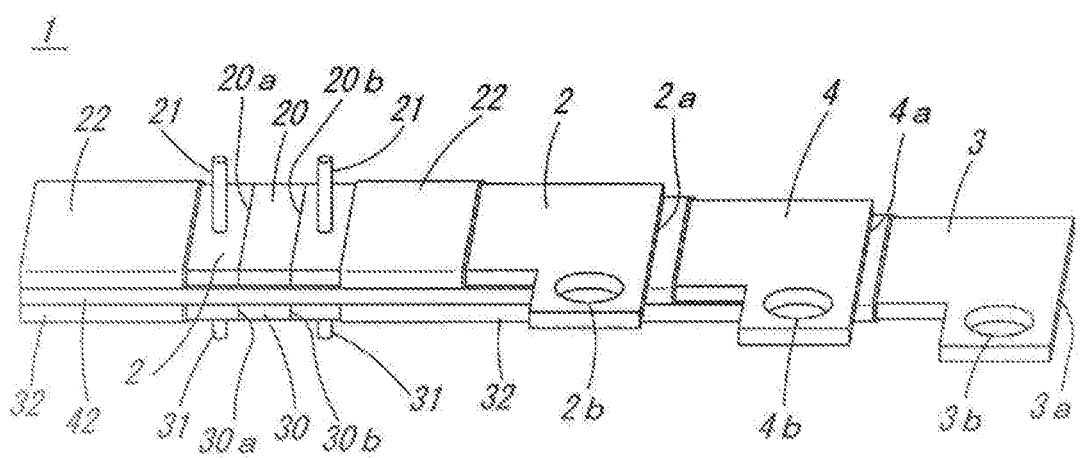
FIG. 1B is a perspective view of the current detection device according to the same embodiment.

As shown in FIG. 1A, the current detection device 1 has a first base material 2, a second base material 3, and a third base material 4. The first base material 2 is a so-called bus bar, made of a metal such as copper, and formed in a long substantially rectangular shape. Moreover, as shown in FIG. 2, the first base material 2 is composed of a pair of first base materials 2, and a first resistor 20 is sandwiched between the pair of first base materials 2. As shown in FIG. 1 and FIG. 2, the first resistor 20 is formed in a thick plate-like and short rectangular shape and made of, for example, a Cu—Mn-based alloy, a Cu—Ni-based alloy, a Ni—Cr-based alloy, or the like. As shown in FIG. 1 and FIG. 2, to both side surfaces 20a, 20b of the thus formed first resistor 20, the first base material 2 located on the left in the illustration is joined by welding to one side surface 20a of the first resistor 20, and the first base material 2 on the right in the illustration is joined by welding to the other side surface 20b of the first resistor 20. As a result, the first resistor 20 is sandwiched between the pair of first base materials 2, so that the first base material 2 and the first resistor 20 are integrally formed.

On the other hand, on the pair of first base materials 2, as shown in FIG. 1 and FIG. 2, first measurement terminals 21 are erected and fixed by welding on (in the illustration, on upper surfaces of) the pair of first base materials 2, respectively. The first measurement terminals 21 are made of copper, tin plating, or the like, on which a first substrate 5 for current detection shown in FIG. 2B can be mounted.

Still on the other hand, the pair of first base materials 2 are insulation coated by coating most of the first base materials 2 except for places where the first resistor 20 and the first measurement terminals 21 are formed, with a first insulating layer 22 formed by printing, powder, or the like. As a result, as shown in FIG. 1B, insulation property for each phase can be ensured even when the first base material 2, the second base material 3, and the third base material 4 are stacked. In one side surface 2a side (the right side shown in FIG. 1) along the longitudinal direction of the first base material 2, a circular bolt hole 2b for inserting a shaft portion of a bolt (not shown) is formed so as to penetrate in the vertical direction.

The second base material 3 is a so-called bus bar, made of a metal such as copper, and formed in a long substantially rectangular shape. As shown in FIG. 2, the second base material 3 is composed of a pair of second base materials 3, and a second resistor 30 is sandwiched between the pair of second base materials 3. As shown in FIG. 1 and FIG. 2, the second resistor 30 is formed in a thick plate-like and short rectangular shape and made of, for example, a Cu—Mn-based alloy, a Cu—Ni-based alloy, a Ni—Cr-based alloy, or the like. To both side surfaces 30a, 30b of the thus formed second resistor 30, as shown in FIG. 1 and FIG. 2, the second base material 3 located on the left in the illustration is joined by welding to one side surface 30a of the second resistor 30, and the second base material 3 located on the right in the illustration is joined by welding to the other side surface 30b of the second resistor 30. As a result, the second resistor 30 is sandwiched between the pair of second base materials 3, so that the second base material 3 and the second resistor 30 are integrally formed.

Still on the other hand, on the pair of second base materials 3, as shown in FIG. 1 and FIG. 2, second measurement terminals 31 are erected and fixed by welding on (in the illustration, on lower surfaces of) the pair of second base materials 3, respectively. The second measurement terminals 31 are made of copper, tin plating, or the like, on which a second substrate 6 for current detection shown in FIG. 2B can be mounted.

Still on the other hand, the pair of second base materials 3 are insulation coated by coating most of the second base materials 3 except for places where the second resistor 30 and the second measurement terminals 31 are formed, with a second insulating layer 32 formed by printing, powder, or the like. As a result, as shown in FIG. 1B, the insulation property for each phase can be ensured even when the first base material 2, the second base material 3, and the third base material 4 are stacked. In one side surface 3a side (the right side shown in FIG. 1) along the longitudinal direction of the second base material 3, a circular bolt hole 3b for inserting a shaft portion of a bolt (not shown) is formed so as to penetrate in the vertical direction.

The third base material 4 is a so-called bus bar, made of a metal such as copper, and formed in a long substantially rectangular shape. The third base material 4 is insulation coated by coating substantially the entire area with a third insulating layer 42 formed by printing, powder, or the like. As a result, as shown in FIG. 1B, the insulation property for each phase can be ensured even when the first base material 2, the second base material 3, and the third base material 4 are stacked. In one side surface 4a side (the right side shown in FIG. 1) along the longitudinal direction of the third base material 4, a circular bolt hole 4b for inserting a shaft portion of a bolt (not shown) is formed so as to penetrate in the vertical direction.

Thus, the first base material 2, the second base material 3, and the third base material 4 configured as described above are stacked to be used as shown in FIG. 1B. That is, as shown in FIG. 1B and FIG. 2, the lower surface of the first base material 2 insulation coated by being coated with the first insulating layer 22 is arranged in close contact with the upper surface of the third base material 4 insulation coated by being coated with the third insulating layer 42, and the upper surface of the second base material 3 insulation coated by being coated with the second insulating layer 32 is arranged in close contact with the lower surface of the third base material 4 insulation coated by being coated with the third insulating layer 42, whereby the first base material 2, the second base material 3, and the third base material 4 are stacked. In this state, as shown in FIG. 2B, the first substrate 5 for current detection is mounted on the first measurement terminals 21, whereby the first substrate 5 is arranged and fixed in a position opposing the first base material 2, and the second substrate 6 for current detection is mounted on the second measurement terminals 31, whereby the second substrate 6 is arranged and fixed in a position opposing the second base material 3. In stacking the first base material 2, the second base material 3, and the third base material 4, they may be stacked using an adhesive or the like or may be simply stacked. They may be stacked in any manner.

Incidentally, as shown in FIG. 2B, the first substrate 5 is formed in a horizontally long rectangular shape and made of resin or the like, and on which various IC chips 50 constituting a current detection circuit are mounted. The IC chips 50 are electrically connected by a wiring pattern (not shown). As shown in FIG. 2B, the first substrate 5 is provided with through holes 5a into which the first measurement terminals 21 can be inserted. Thus, by inserting the first measurement terminals 21 into the through holes 5a, the first substrate 5 for current detection is mounted.

On the other hand, as shown in FIG. 2B, the second substrate 6 is formed in a horizontally long rectangular shape and made of resin or the like, and on which various IC chips 60 constituting a current detection circuit are mounted. The IC chips 60 are electrically connected by a wiring pattern (not shown). As shown in FIG. 2B, the second substrate 6 is provided with through holes 6a into which the second measurement terminals 31 can be inserted. Thus, by inserting the second measurement terminals 31 into the through holes 6a, the second substrate 6 for current detection is mounted.

Thus, as shown in FIG. 2B, the current detection device 1 on which the first base material 2, the second base material 3, and the third base material 4 are stacked, the first substrate 5 for current detection is mounted on the first measurement terminals 21, and the second substrate 6 for current detection is mounted on the second measurement terminals 31 is connected between the three-phase inverter INV and the motor M of the motor control device 100 shown in FIG. 3. As a result, the current value of any one of the three phases flowing from the three-phase inverter INV to the motor M is taken out from the first measurement terminals 21, is subjected to signal processing by the various IC chips 50 constituting the current detection circuit, and is output as a detected current from an output terminal (not shown) of the first substrate 5. Furthermore, the current value of any one of the three phases flowing from the three-phase inverter INV to the motor M is taken out from the second measurement terminals 31, is subjected to signal processing by the various IC chips 60 constituting the current detection circuit, and is output as a detected current from an output terminal (not shown) of the second substrate 6.

Thus, this makes it possible to detect the current values of any two of the three phases flowing from the three-phase inverter INV to the motor M, so that the current values of the three phases can be detected. This point will be described in detail by describing the configuration of the motor control device 100 shown in FIG. 3.

The motor control device 100 generates a PWM signal by vector control to drive and control the motor. In the vector control, the current flowing through an armature winding of the motor is separated into a magnetic flux direction of a permanent magnet and a direction orthogonal thereto to regulate independently and control magnetic flux and generated torque. In the current control, a d-axis current (exciting current) and a q-axis current (torque component current) represented by a d-q coordinate system rotating together with a rotor of the motor are used. Specifically, as shown in FIG. 3, a d-axis current command value Idref and a q-axis current command value Iqref are input to the motor control device 100. The d-axis current command value Idref is input to a subtractor 101 and the q-axis current command value Iqref is input to a subtractor 102. The subtractor 101 subtracts a d-axis current value Id from the d-axis current command value Idref to obtain a d-axis current deviation ΔId. Furthermore, the subtractor 102 subtracts a q-axis current value Iq from the q-axis current command value Iqref to obtain a q-axis current deviation ΔIq.

Then, the d-axis current deviation ΔId thus obtained by the subtractor 101 is subjected to a PID (Proportional-Integral-Differential) operation carried out by a PI control unit 103. As a result, a d-axis voltage command value Vd represented by the d-q coordinate system is generated. Further, the q-axis current deviation ΔIq obtained by the subtractor 102 is subjected to a PID operation carried out by a PI control unit 104. As a result, a q-axis voltage command value Vq represented by the d-q coordinate system is generated.

Then, the d-axis voltage command value Vd and the q-axis voltage command value Vq thus generated are converted into values represented by an α-β coordinate system by a dq/αβ coordinate conversion unit 105, and further converted into each phase voltage command value Vu, Vv, Vw by an αβ/UVW coordinate conversion unit 106. The rotation angle θ of the rotor of the motor M is used for calculation of the coordinate conversion in the dq/αβ coordinate conversion unit 105.

Then, each phase voltage command value Vu, Vv, Vw thus converted is output to a PWM conversion unit 107, and converted into a PWM signal in the PWM conversion unit 107 to be output to the three-phase inverter INV. The three-phase inverter INV converts the power of a direct current power supply (not shown, such as a battery) into three-phase alternating current power in response to the PWM signal, thereby driving and controlling the motor M.

Incidentally, each phase output terminal of the three-phase inverter INV is connected to each phase stator winding (not shown) of the motor M, and the current detection device 1 is connected as a wiring for connecting the two. The current detection device 1 detects current values of any two phases (Iu and Iw are exemplified in the present embodiment) of current values Iu, Iv, Iw of the three phases. That is, the current value Iu of one of the three phases is taken out from the first measurement terminals 21, is subjected to signal processing by the various IC chips 50 constituting the current detection circuit, and is output as the detected current from the output terminal (not shown) of the first substrate 5. Furthermore, the current value Iw of any one of the three phases is taken out from the second measurement terminals 31, is subjected to signal processing by the various IC chips 60 constituting the current detection circuit, and is output as the detected current from the output terminal (not shown) of the second substrate 6. As a result, the current values of any two phases (Iu and Iw are exemplified in the present embodiment) of the current values Iu, Iv, Iw of the three phases can be detected by the current detection device 1. As shown in FIG. 2B, the insulating property for each phase is ensured since the first base material 2 is insulation coated by being coated with the first insulating layer 22, the second base material 3 is insulation coated by being coated with the second insulating layer 32, and the third base material 4 is insulation coated by being coated with the third insulating layer 42 although the first base material 2, the second base material 3, and the third base material 4 are stacked. Accordingly, a situation in which an inaccurate current value is detected can be prevented when the current values of any two phases (Iu and Iw are exemplified in the present embodiment) of the current values Iu, Iv, Iw of the three phases are detected.

The current values Iu, Iw thus detected are then converted into an α-β coordinate system in a UVW/αβ coordinate conversion unit 108. Incidentally, it is known that a relational expression of Iu+Iv+Iw=0 holds for the three-phase alternating current. Therefore, when the current values of any two of the three phases are detected, the current value of the remaining one phase can be worked out by calculation. Thus, the UVW/αβ coordinate conversion unit 108 calculates the current value of Iv from the relational expression of Iu+Iv+Iw=0 based on the detected current values Iu, Iw and then converts it to the α-β coordinate system.

Then, the data thus converted into the α-β coordinate system is converted into the d-q coordinate system to be calculated into the d-axis current value Id and the q-axis current value Iq in an αβ/dq coordinate conversion unit 109. The calculated d-axis current value Id is input to the subtractor 101, and the q-axis current value Iq is input to the subtractor 102. The rotation angle θ of the rotor of the motor M is used for the calculation of the coordinate conversion in the αβ/dq coordinate conversion unit 109.

Thus, the motor M is driven and controlled in this way, and the current values of any two of the three phases flowing from the three-phase inverter INV to the motor M can be detected. When the current values of any two of the three phases flowing from the three-phase inverter INV to the motor M are detected, the current value of the remaining one phase can be worked out by calculation. Therefore, if the current values of any two of the three phases flowing from the three-phase inverter INV to the motor M can be detected, the current values of the three phases can be detected.

Thus, according to the present embodiment described above, the lower surface of the first base material 2 insulation coated by being coated with the first insulating layer 22 is arranged in close contact with the upper surface of the third base material 4 insulation coated by being coated with the third insulating layer 42, and the upper surface of the second base material 3 insulation coated by being coated with the second insulating layer 32 is arranged in close contact with the lower surface of the third base material 4 insulation coated by being coated with the third insulating layer 42. Moreover, the first base material 2 is provided with the first resistor 20 and the first measurement terminals 21, so that the first substrate 5 can be mounted on the first measurement terminals 21. Thus, the first substrate 5 is arranged and fixed in the position opposing the first base material 2. Furthermore, the second base material 3 is provided with the second resistor 30 and the second measurement terminals 31, so that the second substrate 6 can be mounted on the second measurement terminals 31. Thus, the second substrate 6 is arranged and fixed in the position opposing the second base material 3.

Thus, according to the present embodiment, the first substrate 5 and the second substrate 6 mounted with the current detection circuits can be arranged in a state in which the first base material 2, the second base material 3, and the third base material 4 are stacked. Therefore, the demands for low resistance and low inductance can be satisfied.

It is noted that the current detection device 1 shown in the present embodiment is merely an example, and various modifications and changes can be made within the scope of the gist of the present invention described in the claims. For example, as shown in FIG. 4, predetermined places of the first base material 2, second base material 3, third base material 4 arranged in close contact may all be enclosed by an insulating case 7 so as to conceal the first substrate 5 and the second substrate 6.

Figure 4:
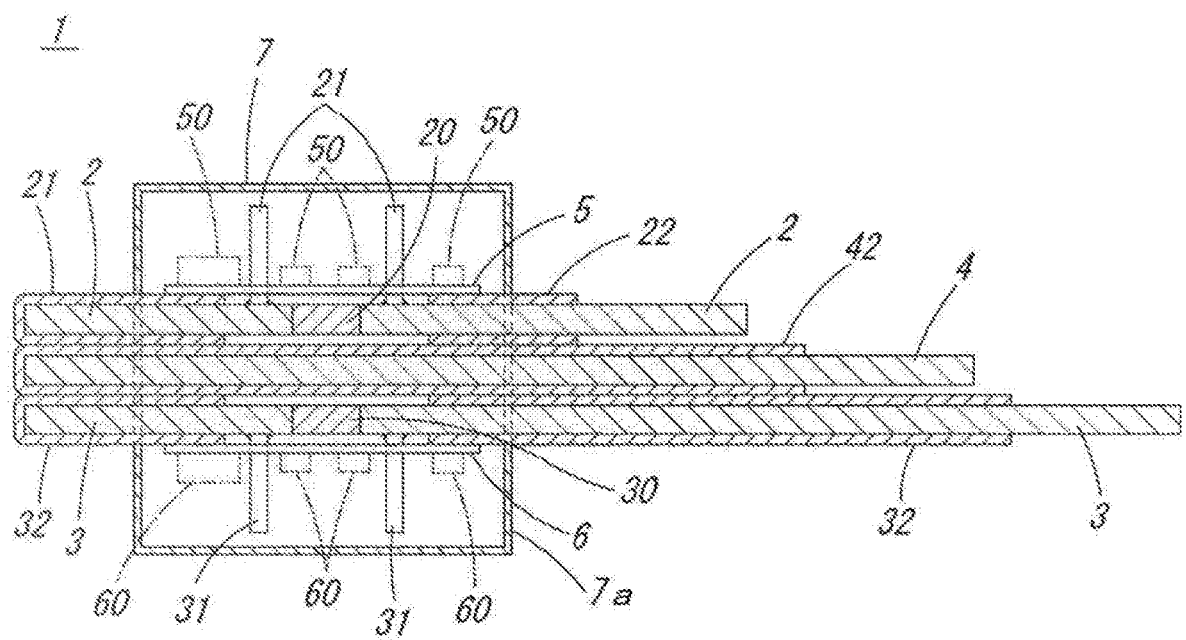
FIG. 4 is a cross sectional view showing a state in which the first substrate and the second substrate are mounted on the current detection device according to the same embodiment and the mounted first substrate and second substrate are enclosed by an insulating case.

In FIG. 4, the example in which the predetermined places of the first base material 2, second base material 3, third base material 4 arranged in close contact are enclosed by one insulating case 7 so as to conceal the first substrate 5 and the second substrate 6 is shown. However, the present invention is not limited thereto, and separate insulating cases may be used to enclose the first substrate 5 and the second substrate 6, respectively.

Further, a surface (outer peripheral surface) 7a of the insulating case 7 may be covered with a conductive material such as a metal to make it conductive. In this way, the first substrate 5 and the second substrate 6 are also shielded, so that the high frequency current can be prevented from radiating to the surroundings.

On the other hand, in the present embodiment, the example in which Iu and Iw are detected as the current values of the two of the three phases of the three-phase inverter INV is shown. However, the present invention is not limited thereto, and the current values may be Iv and Iw or may be Iu and Iv. It is only necessary to detect the current values of any two of the three phases.

What is claimed:

1. A current detection device comprising:
a plurality of base materials that are insulation coated and are connected between a three-phase inverter and a motor;
the plurality of base materials include a first base material, a second base material, and a third base material;
the first base material is in contact with an upper surface of the third base material and includes, on a portion not insulation coated, a first resistor and a first measurement terminal fixed on the first base material; and
the second base material is in contact with a lower surface of the third base material and includes, on a portion not insulation coated, a second resistor, and a second measurement terminal fixed on the second base material.

2. The current detection device according to claim 1, further comprising:
a first substrate into which the first measurement terminal is inserted and which is arranged and fixed in a position opposing the first base material; and
a second substrate into which the second measurement terminal is inserted and which is arranged and fixed in a position opposing the second base material.

3. The current detection device according to claim 2, wherein:
the first base material, second base material, and third base material are enclosed by an insulating case so as to conceal the first substrate and the second substrate in a state in which the first substrate is arranged and fixed in the position opposing the first base material by the first measurement terminal, and the second substrate is arranged and fixed in the position opposing the second base material by the second measurement terminal; and the insulating case has an outer peripheral surface which is electrically conductive.

\* \* \* \* \*